(12) United States Patent
Kajiwara et al.

(10) Patent No.: US 7,879,455 B2
(45) Date of Patent: Feb. 1, 2011

(54) HIGH-TEMPERATURE SOLDER, HIGH-TEMPERATURE SOLDER PASTE AND POWER SEMICONDUCTOR USING SAME

(75) Inventors: Ryoichi Kajiwara, Hitachi (JP); Kazutoshi Itou, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 922 days.

(21) Appl. No.: 11/633,419

(22) Filed: Dec. 5, 2006

(65) Prior Publication Data
US 2007/0125449 A1 Jun. 7, 2007

(30) Foreign Application Priority Data
Dec. 5, 2005 (JP) .............................. 2005-350105

(51) Int. Cl.
*H01L 23/48* (2006.01)
*B23K 35/26* (2006.01)
*C22C 13/02* (2006.01)

(52) U.S. Cl. .................. 428/620; 428/646; 257/772; 257/712; 257/700; 257/787; 420/560; 420/561; 148/33; 148/400; 438/106; 438/108; 438/121; 438/617; 156/230; 156/292

(58) Field of Classification Search ......... 420/561–562; 228/248.1, 256, 262.9; 148/400, 413; 257/772, 257/779, 782, 783; 438/121–123; 174/259–263; 252/512–514
See application file for complete search history.

(56) References Cited

U.S. PATENT DOCUMENTS

| | | | | |
|---|---|---|---|---|
| 4,809,135 A | * | 2/1989 | Yerman | ...................... 361/772 |
| 5,621,243 A | * | 4/1997 | Baba et al. | ................... 257/712 |
| 5,796,591 A | * | 8/1998 | Dalal et al. | .................. 361/779 |
| 7,443,014 B2 | * | 10/2008 | Otremba | ...................... 257/676 |

FOREIGN PATENT DOCUMENTS

| | | | |
|---|---|---|---|
| JP | 2001-144111 | * | 5/2001 |
| JP | 2003-290976 | * | 10/2003 |
| JP | 2005-177842 | * | 7/2005 |
| JP | 2006-190850 | * | 7/2006 |

OTHER PUBLICATIONS

TRitt, "Holey and Unholey Semiconductors," Science, 1999, V283, No. 5403, pp. 804-805; (Printed pp. 1-4).*

(Continued)

*Primary Examiner*—Stanley Silverman
*Assistant Examiner*—Kallambella Vijayakumar
(74) *Attorney, Agent, or Firm*—Antonelli, Terry, Stout & Kraus, LLP.

(57) ABSTRACT

The present invention intends to provide a power semiconductor device using a high-temperature lead-free solder material, the high-temperature lead-free solder material having the heat resistant property at 280° C. or more, and the bondability at 400° C. or less, and excellent in the suppliabilty and wettability of solder, and in the high-temperature storage reliability and the temperature cycle reliability. In the power semiconductor device according to the present invention, a semiconductor element and a metal electrode member were bonded each other by a high-temperature solder material comprising Sn, Sb, Ag, and Cu as the main constitutive elements and the rest of other unavoidable impurity elements wherein the high-temperature solder material comprises 42 wt %$\leq$Sb/(Sn+Sb)$\leq$48 wt %, 5 wt %$\leq$Ag<20 wt %, 3 wt %$\leq$Cu<10 wt %, and Ag+Cu$\leq$25 wt %.

8 Claims, 9 Drawing Sheets

OTHER PUBLICATIONS

Shalaby, "Correlation between thermal diffusivity and activation energy of ordering of lead free solder alloys Sn65-xAg25Sb10Cux rapidly solidified from molten state," J. Material Science: Materials in Electronics 2005, V16, pp. 187-191.*

* cited by examiner

FIG. 3

| No | SOLDER COMPOSITION | | | | INJECTION TEMPERATURE | HEAT RESISTANT | SOLDER GRAIN SIZE | VOLUME RATIO OF SOLDER/LIQUID | SUPPLI-ABILITY | WETTABILITY (Cu/Ni) | | | JUDG-MENT |
|---|---|---|---|---|---|---|---|---|---|---|---|---|---|
| | Sn | Sb | Ag | Cu | | | | | | TRI | TETRA | PENTA | |
| 1 | Bal. | 45 | 9 | 8 | 400 | 330 | 0.2–0.3 | 3/7 | ○ | ×/△ | ×/△ | ×/× | × |
| 2 | Bal. | 40 | 10 | 8 | 380 | 320 | 0.2–0.3 | 3/7 | ○ | ×/○ | ×/○ | ×/△ | × |
| 3 | Bal. | 35 | 11 | 8 | 360 | 300 | 0.2–0.3 | 3/7 | ○ | ○/○ | ○/○ | △/△ | ○ |
| 4 | Bal. | 35 | 8 | 6 | 360 | 225 | 0.2–0.3 | 3/7 | ○ | ○/○ | ○/○ | △/△ | × |
| 5 | Bal. | 35 | 15 | 4 | 360 | 300 | 0.2–0.3 | 3/7 | ○ | ○/○ | ○/○ | — | ○ |
| 6 | Bal. | 40 | 7 | 4 | 380 | 320 | 0.2–0.3 | 3/7 | ○ | ○/○ | ○/○ | — | ○ |
| 7 | Bal. | 35 | 11 | 8 | 360 | 300 | 0.2–0.3 | 6/4 | ○ | ○/○ | ○/○ | — | ○ |
| 8 | Bal. | ↑ | ↑ | ↑ | ↑ | ↑ | 0.2–0.3 | 7/3 | × | ○/○ | ○/○ | — | × |
| 9 | Bal. | ↑ | ↑ | ↑ | ↑ | ↑ | 0.2–0.3 | 1/9 | △ | ○/○ | ○/○ | — | △ |
| 10 | Bal. | ↑ | ↑ | ↑ | ↑ | ↑ | 0.01–0.05 | 5/5 | ○ | △/× | △/× | — | × |
| 11 | Bal. | ↑ | ↑ | ↑ | ↑ | ↑ | 0.05–0.1 | 5/5 | ○ | ○/△ | ○/△ | — | △ |
| 12 | Bal. | ↑ | ↑ | ↑ | ↑ | ↑ | 0.1–0.2 | 5/5 | ○ | — | ○/○ | — | ○ |
| 13 | Bal. | ↑ | ↑ | ↑ | ↑ | ↑ | 0.4–0.5 | 5/5 | ○ | — | ○/○ | — | ○ |
| 14 | Bal. | ↑ | ↑ | ↑ | ↑ | ↑ | 0.5–0.7 | 5/5 | △ | — | ○/○ | — | △ |
| 15 | Bal. | ↑ | ↑ | ↑ | ↑ | ↑ | 0.7+1.0 | 2/8 | × | — | ○/○ | — | × |
| 16 | Bal. | ↑ | ↑ | ↑ | ↑ | ↑ | 0.1–0.4 | 5/5 | ○ | — | ○/○ | — | ○ |
| | (wt%) | | | | (°C) | | (mmφ) | VOLUME RATIO | | (ETHYLENGLYCOL) | | | |

○ : GOOD   △ : INSUFFICIENT FOR REQUIRED LEVEL   × : PRACTICALLY UNUSABLE DUE TO PROBLEMS

FIG. 4

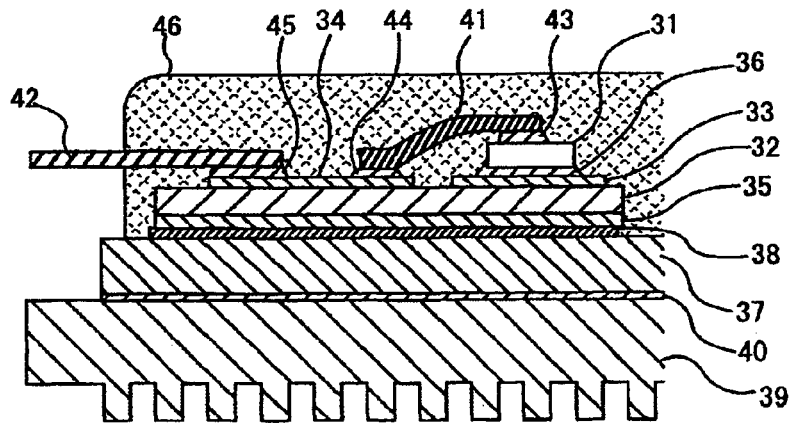

SnSb BINARY PHASE DIAGRAM

FIG. 18

| No | SOLDER COMPOSITION (wt%) | | | | MECHANICAL PROPERTIES AT ROOM TEMPERATURE | | | MECHANICAL PROPERTIES AT 200°C | | |
|---|---|---|---|---|---|---|---|---|---|---|
| | Sn | Sb | Ag | Cu | BRAKING STRENGTH (N/mm²) | ELASTIC MODULUS (%) | ELONGATION (N/mm²) | BRAKING STRENGTH (N/mm²) | ELASTIC MODULUS (%) | ELONGATION (N/mm²) |
| 1 | Bal. | 45 | 9 | 7 | 80 × 10³ | ≒ 0 | 59 × 10³ | 74 × 10³ | 4 | 38 × 10³ |
| 2 | Bal. | 40 | 10 | 8 | 73 × 10³ | ≒ 0 | 63 × 10³ | 60 × 10³ | 4 | 38 × 10³ |
| 3 | Bal. | 35 | 11 | 9 | 75 × 10³ | ≒ 0 | 64 × 10³ | 56 × 10³ | 24 | 19 × 10³ |

NOTE: MECHANICAL PROPERTIES ARE BASED ON MEASUREMENT RESULTS OF SPECIMENS CONTAINING SHRINKAGE CAVITY DEFECT THEREIN

FIG. 19

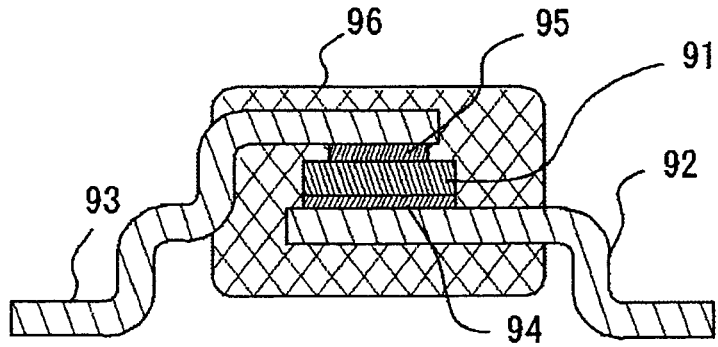

HIGH-TEMPERATURE SOLDER, HIGH-TEMPERATURE SOLDER PASTE AND POWER SEMICONDUCTOR USING SAME

FIELD OF THE INVENTION

The present invention relates to a lead-free solder material for which a high melting point of 280° C. or more is required, and to power semiconductor devices using the lead-free solder material.

BACKGROUND OF THE INVENTION

Conventionally, a high melting-point lead solder which contains lead of 90% or more and other Sn, Ag, etc. of several % and exhibits the melting-point of 280° C. or more has been used at the junction between a power semiconductor device and an external electrode. In recent years, it has become important to protect environment from contamination of harmful substances, and thus the removal of lead from the assembly members of electronic devices is required. However, a high-temperature solder without using lead, the high-temperature solder capable of directly replacing a lead-contained high-temperature solder, has not yet been developed. In the circumstances high-temperature solders of a Zn—Al system, Sn—Sb system, and Bi—Ag system are known as the candidates of possible material. The example of such material is described on paragraphs [0006] to [0012] of JP-A-2003-290976.

BRIEF SUMMARY OF THE INVENTION

Moreover, in the power semiconductor devices for automotive applications, in a stacked junction structure of heat sink/ceramic wiring board/power semiconductor device, a Sn—Pb eutectic solder is used for the junction of heat sink/ceramic wiring board, and a lead-rich solder is used for the junction of ceramic wiring board/power semiconductor device. For lead-freeing, the alternative material candidates such as Sn—Ag—Cu solder are considered for the eutectic solder, however there is no alternative material candidate for the lead-rich solder at this time.

Moreover, in general power semiconductor devices and high frequency semiconductor devices temperature of 260° C. is applied during the reflow process of the secondary mounting process in the case of a high-temperature use. In the circumstances, the alternative material of the lead-rich solder capable of withstanding this reflow temperature and excellent in temperature cycle reliability has not yet been found.

As to the properties required for the high-temperature solder used for mounting the power semiconductors, the following seven items are listed. If these properties are not provided, it is difficult to directly apply the high-temperature solder to the assembly of the semiconductor devices. These properties are 1) Wettability: the solder material is excellent in the wettability to the electrode material of the semiconductor devices and to the metal members used for external connection; 2) Junction temperature: the liquidus temperature is 370° C. or less because the processing temperature of die bonding is 400° C. or less, more preferably 360° C. or less; 3) Heat-resistant temperature: the solder material has heat resistant property capable of withstanding the reflow heating of 260° C. at the time of secondarily mounting the semiconductor devices on a larger device, or withstanding the use in high-temperature environment of 200° C. or 250° C.; 4) Strain relief feature: the solder junction part relaxes the thermal strain associated with the heating and cooling when semiconductor devices are bonded to metal members used for external connection, and thus prevents damages to the semiconductor devices due to the thermal stress, 5) Thermal-fatigue life: the thermal-fatigue life of the solder junction part is sufficiently long against the temperature fluctuation caused by the generation of heat of the semiconductor device, 6) High-temperature reliability: the solder material does not cause a crack, a void formation and a significant reduction in strength associated with the growth of compounds between the solder material and the electrode or metal member of the semiconductor device, 7) Processability: the solder material is processed into a shape which is applicable to the mass production assembly of the semiconductor devices.

The most important properties among these are the wettability, junction temperature, and heat resistant temperature. For the strain relief feature, high-temperature reliability, and thermal-fatigue life, there is still room for the countermeasure according to the design of junction structure or metalizing. Also, for the processability, it is possible to deal with the countermeasure according to the design including the form of solder and the assembly process.

Although the Zn—Al system solder of the prior art has the properties required for the junction temperature and heat-resistant temperature, the wettability with respect to Ni and Cu is poor. Moreover, although the Sn—Sb binary solder of the prior art has a good wettability, it cannot satisfy both of the junction temperature and heat resistant temperature at the same time. Furthermore, the Bi—Ag system solder of the prior art has a problem that the solidus temperature is 262° C. and the heat-resistant temperature is low.

On the other hand, in the conventional power semiconductor devices for automotive use or the like, the perfect lead-freeing of the power semiconductor devices has not been achieved because there is no alternative material for the high-temperature lead solder. In the recent automotive equipments, since the current capacity to be used for each new model changes and the demand for the miniaturization of the power semiconductor devices are increasing, an increase in the power capacity per one semiconductor device is needed. Moreover, the installation places of the power semiconductor devices tend to be gathered into the thermally severe engine room in view of efficiency and securing the living space. In this case, due to the temperature rise of the semiconductor device and an increase in environmental temperature, the temperature difference between low temperature and high temperature which the junction part undergoes increases, and thus the power semiconductor device using the lead-rich solder of the prior art has the problem that the temperature cycle life decreases by an increase of the thermal strain.

Moreover, in the conventional power semiconductor devices and high frequency semiconductor devices, there is a problem that the perfect lead-freeing can not be achieved because the alternative material of the solder used for die bonding and mounting passive elements on a ceramic substrate has not yet been found, which is lead-free and has the heat resistant property at 260° C., reliability for the temperature cycle and the high temperature and high humidity.

The present invention intends to provide the solder excellent in wettability with respect to Ni and Cu, the wettability being a property required for the high-temperature solder, the solder satisfying junction temperature $\leqq 400°$ C., preferably junction temperature $\leqq 370°$ C., heat resistant temperature $\geqq 280°$ C., and moreover the solder being excellent in the temperature cycle life and high-temperature reliability with respect to Cu or Ni.

The present invention intends to provide the solder paste material, which can be easily supplied to the junction part without damaging the wettability with respect to Ni or Cu under inert atmosphere or reduction atmosphere and at the bonding conditions in the range of 350° C. to 400° C., and which can eliminate residual liquid remaining at the junction part after bonding as much as possible.

The present invention intends to provide power semiconductor devices without using lead, which have the reflow resistance at 260° C., the heat resistant reliability under the conditions of 200° C. and 1000 hr or more, and high reliability for the high-temperature cycle.

Other objects, features and advantages of the invention will become apparent from the following description of the embodiments of the invention taken in conjunction with the accompanying drawings.

BRIEF DESCRIPTION OF THE DRAWINGS

FIG. 3 is the specification of the high-temperature solder paste material of Example 2 and the results of the property measurement.

FIG. 4 is an explanatory drawing of the sectional structure of a power semiconductor module of Example 4.

FIG. 18 is an explanatory drawing of mechanical properties of a Sn—Sb—Ag—Cu alloy prepared in Example 7.

FIG. 19 is an explanatory drawing of the sectional structure of an electronic component of Example 7.

DESCRIPTION OF REFERENCE NUMERALS

Figure 1:
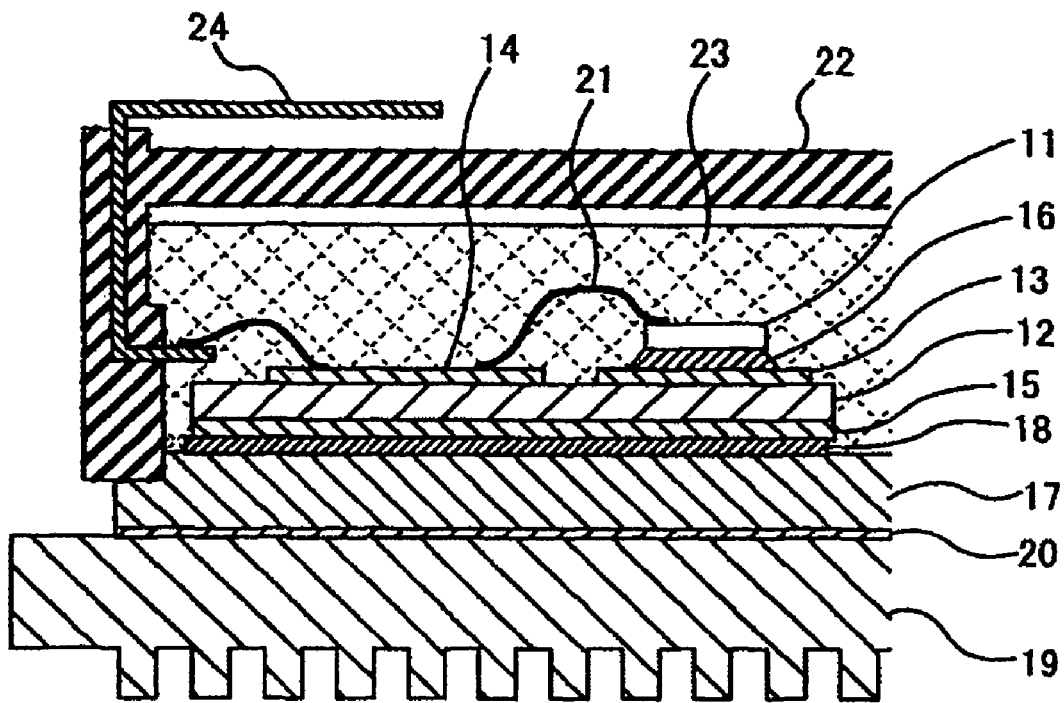
FIG. 1 is an explanatory drawing of the sectional structure of a power semiconductor module of Example 3.

1—High-temperature solder grain, 2—Organic solvent, 11, 31—Power semiconductor device, 12, 32, 53—Ceramic substrate, 13, 14, 33, 34—Metallic circuit pattern, 15, 35—Metal solid pattern, 16, 36, 43, 44, 45—Sn—Sb—Ag—Cu system high-temperature solder, 17, 37—Heat sink, 18, 38—Moderate-temperature solder, 19 39—Radiation fin, 20, 40—High-temperature conduction resin, 21, 78—Al wire, 22—Resin case, 23—Gel silicon resin, 24—External lead, 41—Cu/Fe—Ni/Cu composite lead, 42—External lead, 46—Mold resin, 51, 52—Passive element, 54 56—Circuit terminal, 58, 59, 74, 75, 86, 87, 94, 95—High-temperature solder, 60—High frequency semiconductor device, 61—Cu bump, 62—Au—Sn eutectic junction part, 63 79—Resin, 71—Semiconductor device, 72—Die pad, 73—Stress relief plate, 76—Lead terminal, 81—Ceramic capacitor, 82, 83—Electrode terminal, 84, 85—Metal lead member, 88—Insulating resin, 91—Diode device, 92, 93—Metal lead, 96—Epoxy sealing resin.

DETAILED DESCRIPTION OF THE INVENTION

In the power semiconductor devices of the present invention, semiconductor elements and metal electrode members therein are bonded with the solder composed of the composition defined in the range of $42\ \text{wt}\% \leq \text{Sb}/(\text{Sn}+\text{Sb}) \leq 48\ \text{wt}\%$, $5\ \text{wt}\% \leq \text{Ag} < 20\ \text{wt}\%$, $3\ \text{wt}\% \leq \text{Cu} < 10\ \text{wt}\%$, and $\text{Ag}+\text{Cu} \leq 25\ \text{wt}\%$.

The present invention can provide the high-temperature lead-free solder which is excellent in the wettability with respect to Ni and Cu, satisfies junction temperature $\leq 400°$ C., preferably junction temperature $\leq 370°$ C., and heat resistant temperature $\geq 280°$ C., and is excellent in the temperature cycle life and high-temperature reliability with respect to Cu or Ni.

Moreover, the high-temperature lead-free solder paste of the present invention can easily be supplied to the junction part without damaging the wettability with respect to Ni or Cu at the time of the bonding under inert atmosphere or reduction atmosphere, and it is possible to achieve no-washing by eliminating residual liquid remaining at the junction part after the bonding as much as possible.

Moreover, the power semiconductor devices without using lead of the present invention have the reflow resistance at 260° C., heat resistant reliability under the conditions of 200° C. and 1000 hr or more, and high reliability for the temperature cycle.

Hereinafter, examples of the present invention will be described in detail using the drawings.

EXAMPLE 1

The high-temperature solder material of this example which was composed of Sn, Sb, Ag, and Cu as the main constitutive elements and the rest of other unavoidable impurity elements has the composition defined in the range of $42\ \text{wt}\% \leq \text{Sb}/(\text{Sn}+\text{Sb}) \leq 48\ \text{wt}\%$, $5\ \text{wt}\% \leq \text{Ag} < 20\ \text{wt}\%$, $3\ \text{wt}\% \leq \text{Cu} < 10\ \text{wt}\%$, and $\text{Ag}+\text{Cu} \leq 25\ \text{wt}\%$. Moreover, at least one element selected from the group consisting of Ni, Ge, and Ga of 0.01 wt % to 5.0 wt % and P of 0.005 wt % to 0.5 wt % were added to the high-temperature solder material with the above-described composition.

Figure 7:
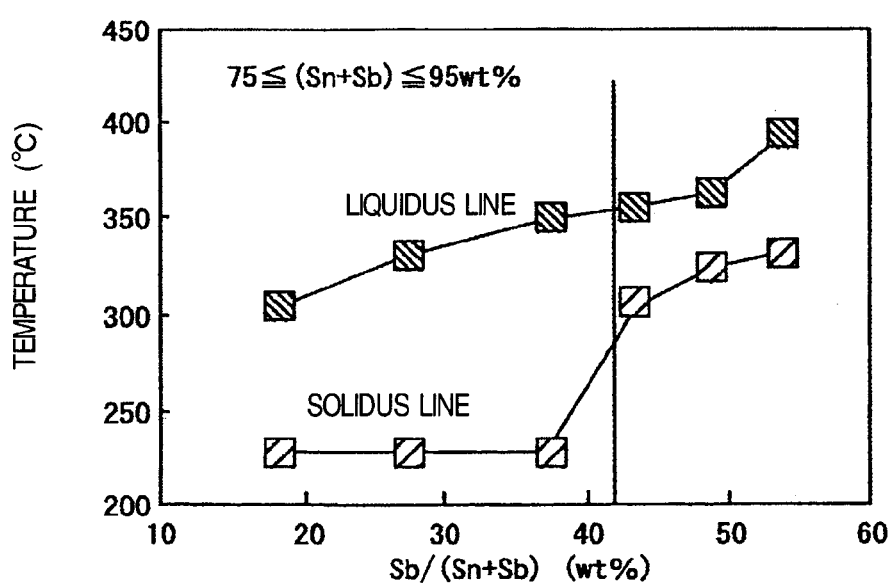
FIG. 7 is an explanatory drawing of the Sb/(Sn+Sb) ratio dependency of the solidus and liquidus temperatures of an Sn—Sb—Ag—Cu system alloy of Example 1.
Figure 8:
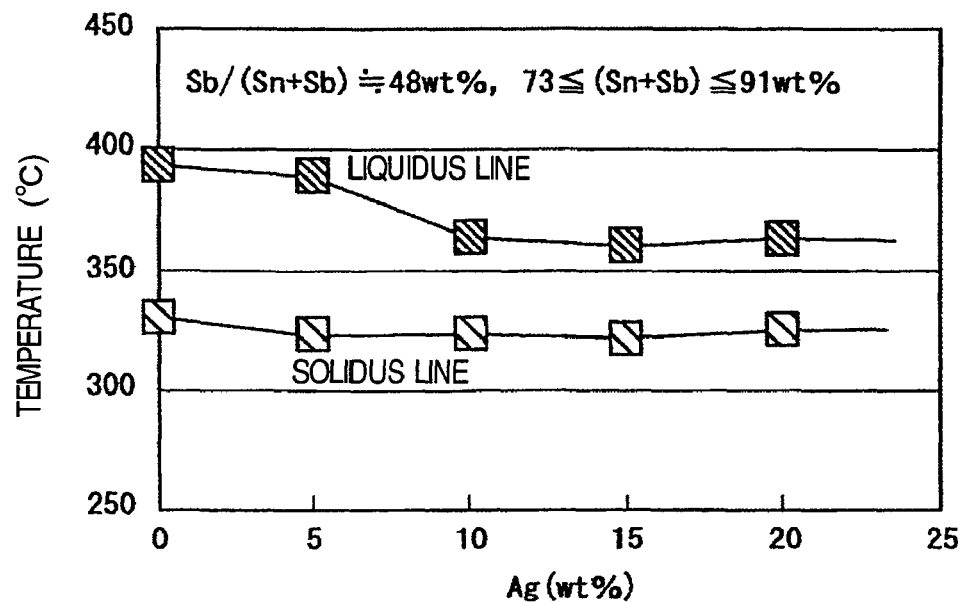
FIG. 8 is an explanatory drawing of the Ag concentration dependency of the solidus and liquidus temperatures of the Sn—Sb—Ag—Cu system alloy of Example 1.
Figure 9:
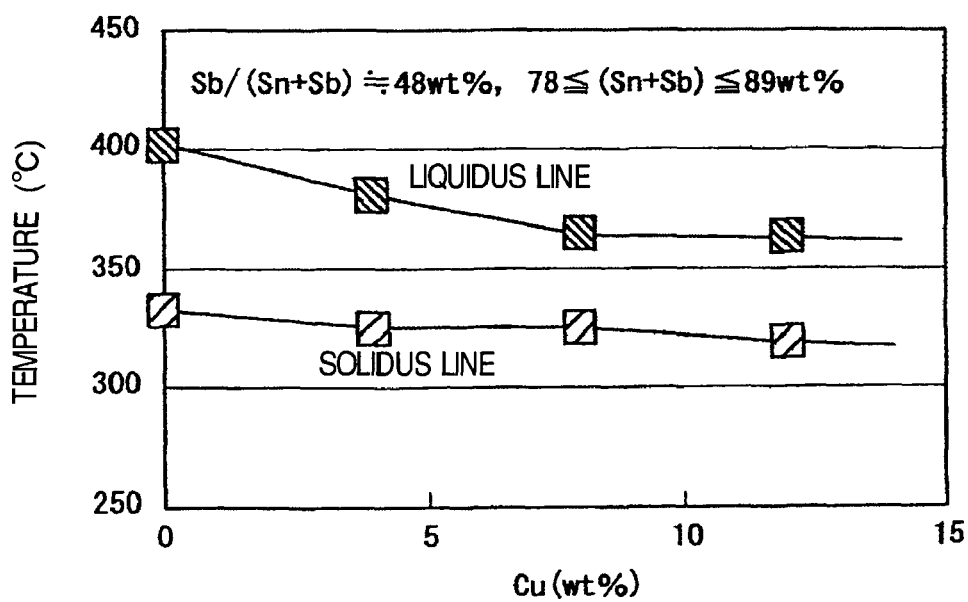
FIG. 9 is an explanatory drawing of the Cu concentration dependency of the solidus and liquidus temperatures of the Sn—Sb—Ag—Cu system alloy of Example 1.

As a result of manufacturing a variety of alloys of the above-described composition by way of trial and investigating the solidus and liquidus temperatures, it was found that the solidus temperature is determined by the composition ratio of Sn and Sb, and is 280° C. or more within the above-described composition range, that a further addition of Ag or Cu hardly decreases the solidus temperature but can reduce only the liquidus temperature, and that the liquidus temperature becomes 370° C. or less with the above-described composition. FIG. 7, FIG. 8, and FIG. 9 show the measurement results. These show the solidus and liquidus temperatures when the ratio of a specific element shows changed in quaternary alloy of Sn—Sb—Ag—Cu, and FIG. 7 is the result specified by the ratio of Sb/(Sn+Sb), FIG. 8 by the content of Ag, and FIG. 9 by the content of Cu.

Figure 16:
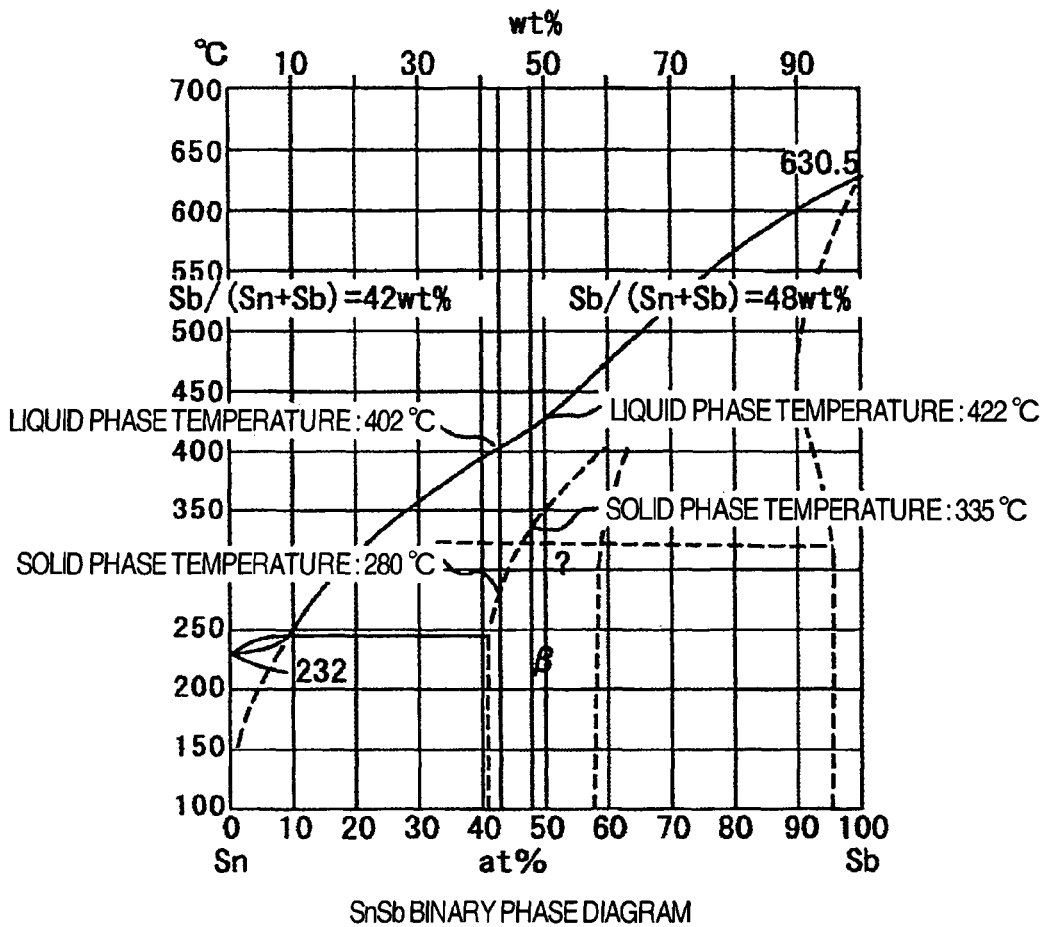
FIG. 16 is the binary phase diagram of Sn—Sb alloy.

As shown in FIG. 7, the solidus temperature is 280° C. or more under the condition of 42 wt %≦Sb/(Sn+Sb). On the other hand, as shown in FIG. 8 and FIG. 9, the liquidus temperature decreased as the addition of Ag and Cu increases at the time of Sb/(Sn+Sb)=48 wt %. As shown in the Sn—Sb binary phase diagram in FIG. 16, the liquidus temperature containing neither Ag nor Cu is 422° C. at Sb/(Sn+Sb)= 48 wt %, however, when Ag of not less than 10 wt %, or Cu of not less than 8 wt % is added, the liquidus temperature became 370° C. as shown in FIG. 8 and FIG. 9. Moreover, it was also confirmed that at the time of Sb/(Sn+Sb)=42 wt % the liquidus temperature ≦370° C. is satisfied under the conditions of 5 wt %≦Ag and 3 wt %≦Cu.

Figure 10:
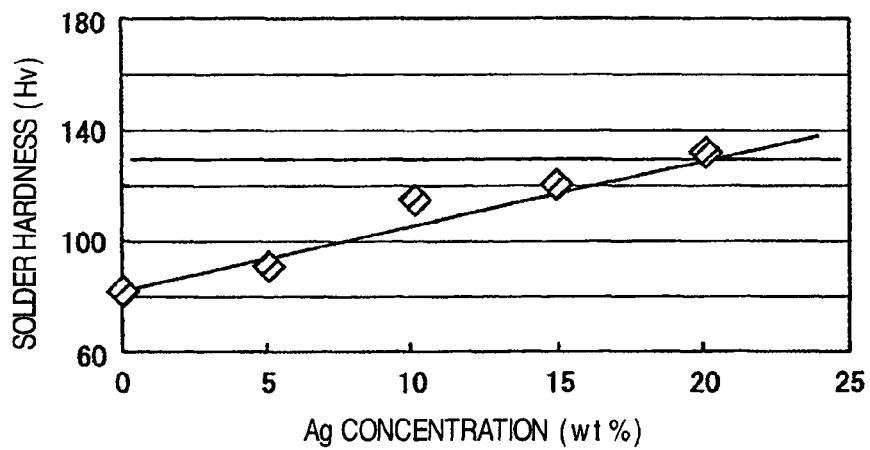
FIG. 10 is an explanatory drawing of the Ag concentration dependency of a Sn—Sb—Ag—Cu system solder hardness of Example 1.
Figure 11:
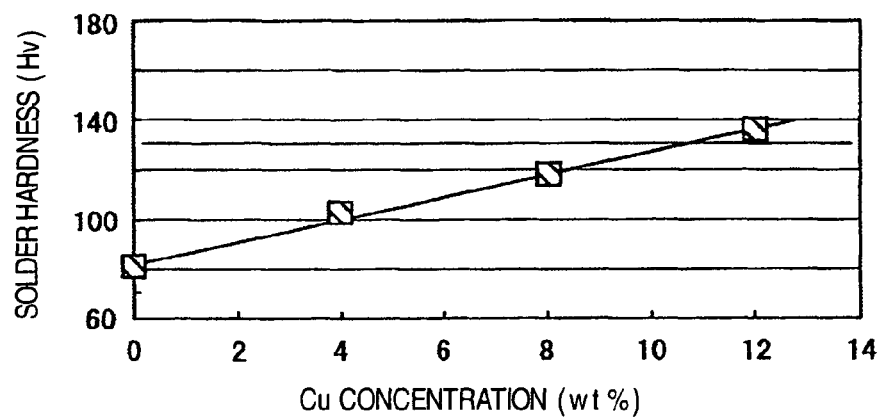
FIG. 11 is an explanatory drawing of the Cu concentration dependency of the Sn—Sb—Ag—Cu system solder hardness of Example 1.
Figure 12:
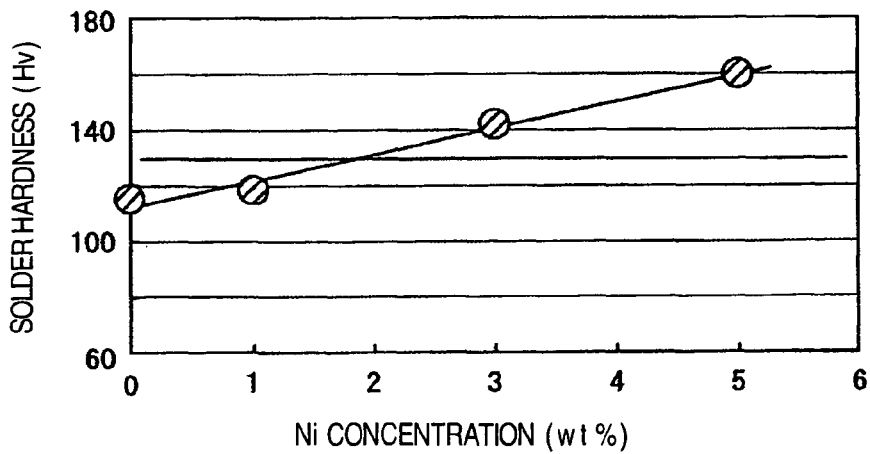
FIG. 12 is an explanatory drawing of the Ni concentration dependency of the Sn—Sb—Ag—Cu system solder hardness of Example 1.

It is preferable that the high-temperature solder material is a soft material capable of reducing the stress given to the semiconductor device after the bonding. FIG. 10, FIG. 11, and FIG. 12 show the measurement results of the hardness of the solders produced by way of trial. As a result of the evaluation of the upper limit of solder hardness based on the bonding of a variety of materials and semiconductor devices, it was found that 130 Hv or less in Vickers hardness is practically suitable.

It was found that although an increase of the content of Ag or Cu as the composition of the solder is effective to reduce the liquidus temperature, the solder becomes hard as the content increases. It was confirmed that Ag<20 wt % as shown in FIG. 10 and Cu<10 wt % as shown in FIG. 11 are the adequate range as the composition satisfying the condition of 130 Hv or less in Vickers hardness. Moreover, as shown in FIG. 12, Ni<2 wt % satisfies the condition of 130 Hv or less in Vickers hardness.

Figure 13:
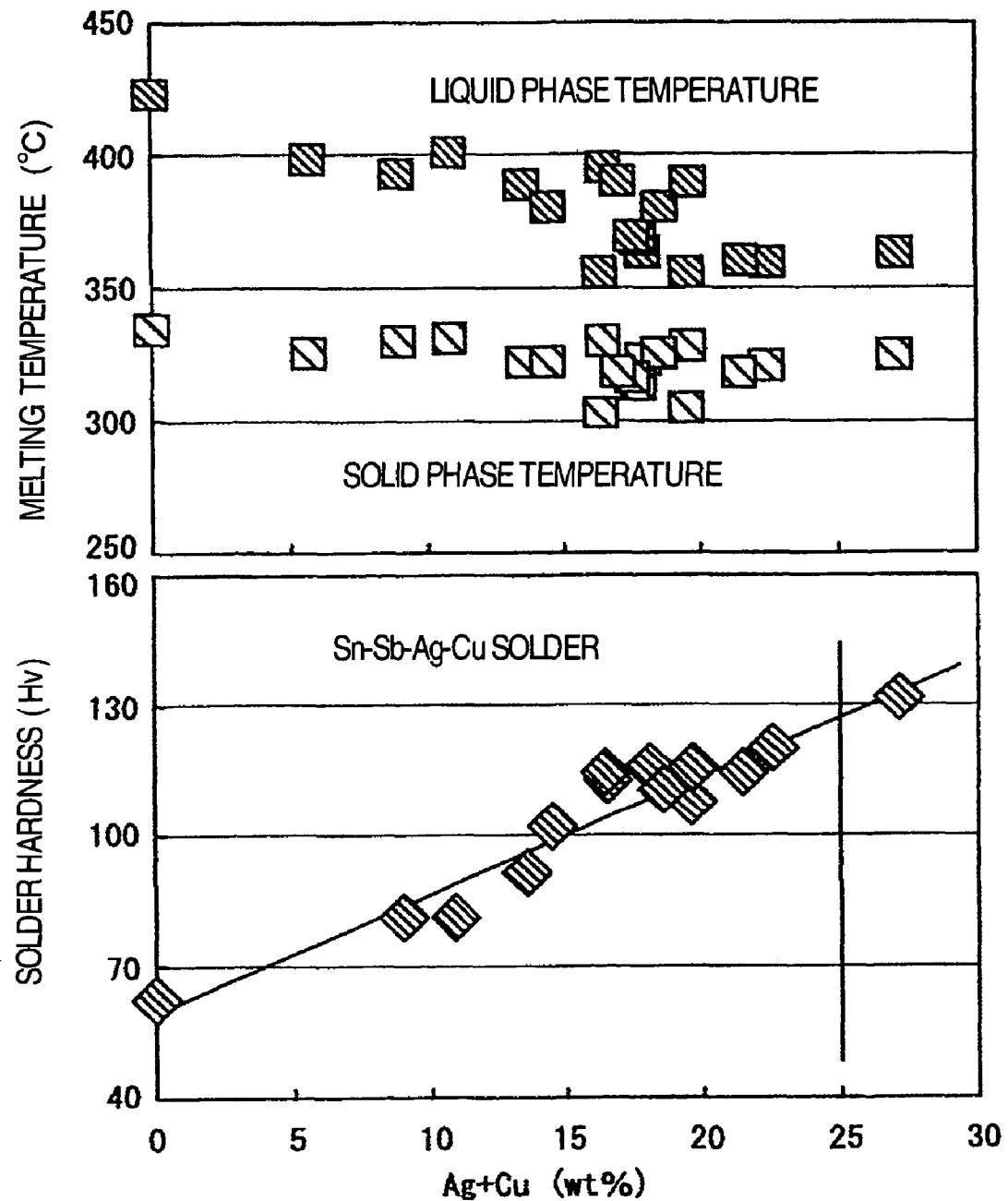
FIG. 13 is an explanatory drawing of the concentration (Ag+Cu) dependency of the solidus and liquidus temperatures and hardness of the Sn—Sb—Ag—Cu system high-temperature solder of Example 1.

FIG. 13 is an explanatory drawing in which the solidus and liquidus temperatures and the Vickers hardness are specified by the content (wt %) of Ag+Cu. It was found that the hardness is more likely to depend on the content of Ag+Cu and the content of Ag+Cu needs to be in the range of Ag+Cu≦25 wt % in order to set the Vickers hardness to 130 Hv or less.

Moreover, with this quaternary solder, the wettability with respect to Cu foil and Ni plated film was investigated on the following three compositions under the heating conditions in the range of 360° C. to 400° C.: (1) 46Sn-35Sb-11Ag-8Cu (Sb/(Sn+Sb)=43 wt %), (2) 42Sn-40Sb-10Ag-8Cu (Sb/(Sn+Sb)=49 wt %), and (3) 38Sn-45Sb-9Ag-8Cu (Sb/(Sn+Sb)=54 wt %). As a result, regarding the wettability to Ni plated film, there was no significant difference in the solder composition at any one of the heating temperatures, and thus good wettability could be confirmed. However, it was found that regarding the wettability to Cu, only the solder of (1) 46Sn-35Sb-11Ag-8Cu (Sb/(Sn+Sb)=43 wt %) exhibits good wettability, and that the area of wet-spreading becomes smaller as the content of Sb increases.

Figure 14:
FIG. 14 is an explanatory drawing of the wet test results of the Sn—Sb—Ag—Cu system high-temperature solder of Example 1 with respect to Cu and Ni.

FIG. 14 shows the results of the wet test concerning the following high-temperature solders: (1) 46Sn-35Sb-11Ag-8Cu (Sb/(Sn+Sb)=43 wt %) and (2) 42Sn-40Sb-10Ag-8Cu (Sb/(Sn+Sb)=49 wt %). It was found that the wettability to Cu of the high-temperature solder (2) 42Sn-40Sb-10Ag-8Cu (Sb/(Sn+Sb)=49 wt %) is poor because the reaction between Sb and Cu contained in the solder intensely occurs and Cu is consumed by the solder and thus the melting-point at the wet edge increases. As a result, it was found that from the viewpoint of wettability to Cu, fewer contents of Sb are better.

As described above, as a result of study and evaluation of the high-temperature solder materials, if the solder composition is defined in the range of 42 wt %≦Sb/(Sn+Sb)≦48 wt %, 5 wt %≦Ag<20 wt %, 3 wt %≦Cu<10 wt %, and Ag+Cu≦25 wt %, then the wettability with respect to Cu, Ni, and Ni—P is good, and the junction temperature can be selected in the range of 350° C. to 400° C., and the heat resistant temperature can be increased to 280° C. or more.

Moreover, it was found that if the solder composition is defined in the range of 42 wt %≦Sb/(Sn+Sb)≦48 wt %, 5 wt %≦Ag<20 wt %, 3 wt %≦Cu<10 wt %, and Ag+Cu≦25 wt %, the solder hardness can be made to be 130 Hv or less in Vickers hardness, and a thermal stress which is generated in the semiconductor device when being bonded to a member whose thermal expansion differs can be reduced.

Moreover, it was confirmed that as to the high-temperature uncontrolled reliability, for example, in the test of 250° C. and 1500 hr, if Ni—P plated film is formed in the junction surface in advance, a metallic reaction with the solder is suppressed, the growth of a Ni—Sn compound and the like is suppressed, and thus the reliability is high. It was found that this is because Ni—P is stable even at high temperature and the reaction with Sn or Sb of the solder is suppressed. In other words, the quaternary solder of this example is also effective in view of the high-temperature reliability. Moreover, even when at least one element selected from the group consisting of Ni, Ge, and Ga of 0.01 wt % to 5.0 wt % and P of 0.005 wt % to 0.5 wt % is added to this quaternary solder, none of the wettability, the heat resistant temperature, the solder hardness, and the like change.

As described above in detail, according to this example, by making the high-temperature solder material to be an alloy having Sn, Sb, Ag, and Cu as the main constitutive elements and the rest of other unavoidable impurity elements wherein the alloy has the composition defined in the range of 42 wt %≦Sb/(Sn+Sb)≦48 wt %, 5 wt %≦Ag<20 wt %, 3 wt %≦Cu<10 wt %, and Ag+Cu≦25 wt %, the solder material excellent in wettability with respect to Ni and Cu, the wettability of a property required for the high-temperature solder, the solder material satisfying the junction temperature ≦400° C., preferably the junction temperature ≦370° C. as well as the heat resistant temperature ≧280° C., and the solder material excellent in the temperature cycle life and high-temperature reliability with respect to Cu or Ni can be provided.

EXAMPLE 2

In this example, in order to provide a solder paste material which can be easily supplied to the junction part without damaging the wettability to Ni or Cu under the conditions of inert atmosphere or reduction atmosphere and at junction temperature in the range of 350° C. to 400° C. and which can eliminate residual liquid remaining at the junction part after the bonding as much as possible, the high-temperature solder paste material which an organic material of a liquid or cream form was mixed was provided, wherein the high-temperature solder paste material was composed of the high-temperature solder of Example 1 and any one or more kinds of materials selected from an ethylene glycol group, an alcoholic group, and a glycerol group whose molecules are constituted from atoms of only C, O, H. Moreover, the grain size (granularity) of the high-temperature solder was set to the range of 0.05 mmφ to 0.5 mmφ, preferably to the range of 0.1 mmφ to 0.5 mmφ, and an organic material whose boiling point is in the range of 150° C. to 400° C. at atmosphere pressure (1 atmosphere) was selected. Incidentally, the grain size (granularity) is a grain diameter after being sized by means of a mesh-like screen. The same is true of the following descriptions.

The Sn—Sb—Ag—Cu system high-temperature solder has a hard property as the material, and is difficult to be processed into a foil or wire shape. For this reason, the form for supplying the solder to a junction part is difficult. Although, the solder paste in which the powders of a solder and the flux are mixed is generally known as the form for supplying a hard solder to the junction surface, the paste which can be used in high-temperature regions where the junction temperature for soldering is in the range of 350° C. to 400° C. has not yet been developed. Moreover, in the case where a bare chip semiconductor device is bonded, the clean bonding which does not use flux under reduction atmosphere is well known. This is because the electrodes and like of a semiconductor device can be prevented from being damaged by a flux having corrosive action.

Figure 15:
FIG. 15 is an explanatory drawing of the wet test results of the Sn—Sb—Ag—Cu system high-temperature solder paste of Example 2 with respect to Cu and Ni.

Then, in this example, the high-temperature solder was processed into the form of a paste where the supply of solder is easy, and the bonding was carried out under the inactive or reducing atmosphere. For the purpose of the pasting, triethylene glycol or tetraethylene glycol which maintains a liquid or cream form at near a room temperature and volatilizes and disappears during heating process as well as which is an organic material inactive to metal was selected, and was mixed with the solder grains of the granularity of 0.1 mmφ to form a paste. And thus, the wettability test with respect to Cu and Ni was carried. As a result, as shown in FIG. 15, it was confirmed that the good wettability with respect to Cu or Ni is obtained.

As to the organic material which was pasted, from the viewpoints of being inactive to metal, not affecting environment, and not being harmful to a human body, the material composed of elements of only C, O, H was selected. Also, it was confirmed that from the viewpoint of being a stable liquid at room temperature, having good storageability, easily volatilizing and disappearing during heating process, and not affecting the wettability, the boiling point under an atmosphere pressure (1 atmosphere) was preferably in the range of 150° C. to 400° C.

Figure 2:
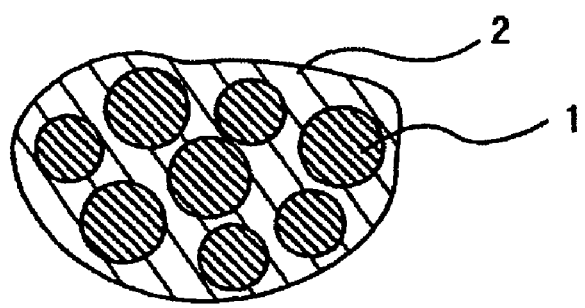
FIG. 2 is an explanatory drawing of the composition of a high-temperature solder paste material of Example 2.

FIG. 2 shows the composition of the high-temperature solder paste material of this example. The paste is composed of a particle-like high-temperature solder grain 1 and a liquid organic solvent 2. FIG. 3 shows the specification of the paste material of this example and the measurement results of the properties. Evaluated items are the following four items: minimum temperature at which the good bonding is possible; heat resistant temperature at which the solder does not melt; the suppliabilty from a dispenser which depends on the granularity of the solder and the volume ratio of the solder/organic solvent (the suppliabilty is determined by whether the continuous supply and the control of the amount thereof are possible); and wettability with respect to Cu and Ni when triethylene glycol, tetraethylene glycol, and pentaethylene glycol are used as the organic solvent. The wettability was evaluated under reduction atmosphere by heating to the same temperature as the junction temperature.

As a result, in the case where the solder composition was the composition defined in the range of Sb/(Sn+Sb)≧49 wt % (No.1, No.2), the wettability with respect to Cu was poor regardless of the kinds of organic solvents and was thus judged as "x" (bad). Moreover, although the wettability in the case where the solder composition was Sb/(Sn+Sb)=40.7 wt % (No.4) was good, the heat resistant property was 230° C. or less and was thus judged as "x". In the case where the solder composition was set to Sb/(Sn+Sb)=43 wt % (No.3, No.5) and 45 wt % (No.6), the following results were obtained; the junction temperature was ≦380° C., the heat resistant temperature was ≧300° C., the solder granularity was in the range of 0.2 mmφ to 0.3 mmφ, the solid-liquid ratio was 3/7, the solder suppliabilty was good, and the wettability with respect to Cu and Ni was good when triethylene glycol and tetraethylene glycol were used, satisfying the necessary conditions for all the items, and was thus judged as "○" (good).

With regard to the granularity of the solder, in the case where it was the fine granularity of 0.01 mmφ to 0.05 mmφ (No.10), the wettability was poor and was thus judged "x", and in the case of 0.05 mmφ to 0.1 mmφ (No.11), the wettability was a little poor and was thus judged as "Δ" (insufficient wettability). On the other hand, in the case where the solder grain was in the range of 0.5 mmφ to 0.7 mmφ (No.14) and in the range of 0.7 mmφ to 1.0 mmφ (No.15), the control accuracy of the amount of the supplied solder became worse and was thus judged as "Δ" and "x", respectively.

Moreover, with regard to the solid-liquid ratio, in the case where the solid ratio was as high as 7/3, the suppliabilty from a dispenser was poor and judged as "x", and in the case where the liquid ratio was as high as 1/9, the controllability of the amount of solder was poor and judged as "Δ". The solder granularity satisfying both of the suppliabilty and wettability was in the range of 0.1 mmφ to 0.5 mmφ. Moreover, it was found that the range of 3/7≦solid/liquid≦6/4 is suitable as the solid-liquid ratio.

According to this example, if the solder composition is set as to satisfy 43 wt %≦Sb/(Sn+Sb)≦45 wt %, the solder junction temperature can be set to 380° C. or less and the heat resistant temperature can be made to be 300° C. or more. Moreover, it was found that if triethylene glycol and tetraethylene glycol are used as the organic solvent, the solder granularity is set in the range of 0.1 mmφ to 0.5 mmφ, and the volume ratio between the solid and liquid is set to 3/7 to 6/4, it is possible to secure the wettability under reduction atmosphere while securing the suppliabilty of the solder. In addition, the organic solvent may be alcohols, glycerols, and esters having the boiling point in the range of 150° C. to 400° C. under atmosphere pressure (1 atmosphere), wherein the constituent elements of the alcohols, glycerols, and esters being made only from C, H, O. If this high-temperature solder is applied to the assembly of power semiconductor devices, the lead-free power semiconductor devices which can be assembled in mass production and which are excellent in high-temperature reliability can be provided. Moreover, since this solder has higher yield strength compared with the lead solder of the prior art, the temperature cycle reliability can be also improved.

As described above in detail, according to this example, by mixing the high-temperature solder material with an organic material of a liquid or cream form wherein the organic material is composed of any one or more kinds of the material selected from an ethylene glycol group, an alcohol group, and a glycerol group which are composed only of C, O, and H, the high-temperature solder paste material can be provided. As a result, the high-temperature solder paste can be easily supplied to the junction part without damaging the wettability with respect to Ni or Cu at the time of the bonding under inert atmosphere or reducing atmosphere, and can eliminate residues remaining at the junction part after the bonding as much as possible, thereby achieving no-washing. Also, by mixing an organic material of a liquid or cream form wherein the organic material is composed of rosin, organic acid, and solvent with the high-temperature solder material of the present invention the high-temperature solder paste material can be provided. As a result, a good solder bondability can be maintained under inert atmosphere, and the residues become inactive, and thus the high-temperature solder paste material, which allows for no-washing, can be provided.

EXAMPLE 3

FIG. 1 shows an example of the sectional structure of a power semiconductor module according to this example. In FIG. 1, a power semiconductor device 11, such as an IGBT, a diode, and a power MOSFET formed in a Si semiconductor chip is mounted on a ceramic substrate 12, and furthermore is mounted on a heat sink 17. The power semiconductor device 11 and the ceramic substrate 12 are bonded by an Sn—Sb—Ag—Cu system high-temperature solder 16 according to Example 1 via a metallic circuit pattern 13. The ceramic substrate 12 and the heat sink 17 are bonded by a moderate temperature solder 18 made of Sn—Ag—Cu (melting-point in the range of 217° C. to 222° C.) via a metal solid pattern 15. The main-current electrode and control electrode of the power semiconductor device are connected to another metallic circuit pattern 14 on the ceramic substrate 12 by an Al wire 21.

To the heat sink 17 is attached a resin case 22, which is integrally molded with an external lead 24, and a gel silicone resin 23 is filled therein. Moreover, the heat sink 17 integrated with the resin case 22 is thermally coupled with a radiation fin 19 via a high-temperature conduction resin 20. The quality of the material of the ceramic substrate 12 is composed of AlN or $Si_3N_4$, and the metallic circuit pattern 13 and metal solid pattern 15 are made of Cu, and Ni—P plating is carried out to the surface thereof. Metalizing of Ti/Ni/Au is carried out to the rear face electrode of the power semiconductor device 11, to be provided for the bonding.

According to this example, the Sn—Sb—Ag—Cu system high-temperature solder 16 of Example 1 is used for bonding the power semiconductor device 11, and the ceramic substrate 12 and heat sink 17 are bonded by the moderate temperature solder 18 of Sn—Ag—Cu. As a result, the semiconductor device without perfectly using lead can be obtained. Moreover, since there is a difference between both of the melting temperatures, the hierarchical solder bonding is possible, thereby facilitating the bonding assembly.

EXAMPLE 4

In this example, the rear face electrode of the power semiconductor device and the metal electrode member connected to the outside were bonded by the high-temperature solder material of Example 1. In the power semiconductor device using the ceramic substrate, furthermore, Ni—P plating was applied to the surface of the metallic circuit pattern which is formed from Cu on the ceramic substrate, and electroless Ni—P plating or electroless Ni—P/Au plating was applied to the uppermost surface of the rear face electrode of the power semiconductor device. Moreover, the electrode in which Ni—P plating or Ni—P/Au plating was applied to the uppermost surface of the main-current electrode of the power semiconductor device was formed, the circuit pattern of the ceramic substrate and the electrodes through which the main current flows were connected by a composite member of a low coefficient of thermal expansion, and the respective junction parts were bonded by the high-temperature solder material of Example 1.

In the rear face electrode of the semiconductor device the surface thereof is typically composed of Ti/Ni/Au, Cr/Ni/Au, or V/Ni/Cu, and in the metal electrode member to be connected to the outside Cu or a member in which Ni plating or Ni—P plating is applied to Cu is used. Since the solder of Example 1 is excellent in the wettability with respect to the above-described members, bonding is easily carried out, and because the solidus temperature of the solder of Example 1 is as high as 280° C. or more, power semiconductor devices having a reflow-resistance at 260° C. and achieving a perfect lead-freeing can be realized.

Moreover, since in the power semiconductor device using the ceramic substrate the coefficient of thermal expansion of the ceramic substrate has low level of 3.0 ppm to 4.6 ppm, the large thermal strain will not occur at the junction even if the semiconductor device is mounted. Moreover, if the junction surface was made to be a Ni—P plated film, even during high-temperature storage under the condition of 250° C. —1500 hr, Ni—Sn compound will not grow in thickness of several μm or more at the junction interface to the high-temperature solder of Example 1, and furthermore there was no growth of a crack, void, or the like, and thus high reliability at high temperature was obtained. Moreover, since the large thermal strain does not occur at the junction interface, even if a temperature cycle of a large temperature difference is applied, the solder material does not cause fatigue failure and thus high reliability in the temperature cycle is obtained. This example can thus provide the power semiconductor device which achieves a perfect lead-freeing, and has high reliability for the heat resistant and the high reliability for the temperature cycle. Furthermore, by connecting between the main-current electrode of the semiconductor device and the metal pattern of the ceramic substrate by the member of low thermal expansion, and bonding by the high-temperature solder of Example 1, the large thermal strain will not occur at any junction part, and thus the extremely high reliability as the power semiconductor device can be obtained.

Hereinafter, this example is described in detail. FIG. 4 shows the sectional structure of a power semiconductor module of this example. In FIG. 4, a power semiconductor device 31 such as an IGBT, a diode, and a power MOSFET formed in a Si semiconductor chip is mounted on a ceramic substrate 32, and furthermore mounted on a heat sink 37. The power semiconductor device. 31 and the ceramic substrate 32 are bonded by an Sn—Sb—Ag—Cu system high-temperature solder 36 of Example 1 via a metallic circuit pattern 33. The ceramic substrate 32 and the heat sink 37 are bonded by a moderate temperature solder 38 made of Sn—Ag—Cu (melting-point in the range of 217° C. to 222° C.) via a metal solid pattern 35. The main-current electrode and control electrode of the power semiconductor device 31 are connected to another metallic circuit pattern 34 on the ceramic substrate 32 by a Cu/Fe—Ni/Cu composite lead 41 of a low coefficient of thermal expansion, and are bonded by Sn—Sb—Ag—Cu system high-temperature solders 43 and 44. Moreover, an external lead 42 is bonded to the metallic circuit pattern 34 on the ceramic substrate 32 by a Sn—Sb—Ag—Cu system high-temperature solder 45. The ceramic substrate 32 on the heat sink 37, the power semiconductor device 31, and the Cu/Fe—Ni/Cu composite lead 41 for connection are covered with a mold resin 46. The heat sink 37 and a radiation fin 39 are glued with a high-temperature conduction resin 40. The quality of the material of the ceramic substrate 32 is composed of AlN or $Si_3N_4$, and the metallic circuit pattern 34 and the metal solid pattern 35 are made of Cu, and Ni—P plating is applied to the surface thereof. Metalizing of Ti/Ni/Au is applied to the rear face electrode of the power semiconductor device 31, thereby being provided for the bonding. Moreover, in the main-current electrode and control electrode of the power semiconductor device 31, Ni—P plating is applied on the Al electrode.

According to this example, the Sn—Sb—Ag—Cu system high-temperature solder is used: at the junction between the ceramic substrate 32 and the rear face electrode of the power semiconductor device 31; at the junction between the main-current electrode and control electrode of the power semiconductor device 31 and the circuit pattern of the ceramic substrate 32 via a low thermal expansion lead; and at the junction between the external lead and the ceramic substrate 32, and a moderate temperature solder of Sn—Ag—Cu is used at the junction between the ceramic substrate 32 and the heat sink 37, and thus the perfect lead-freeing of the semiconductor device can be achieved.

Moreover, according to this example, since there is a difference between the melting temperatures of both of the Sn—Sb—Ag—Cu system high-temperature solder and the moderate temperature solder Sn—Ag—Cu, the hierarchical solder bonding is possible, thereby facilitating the bonding assembly. Moreover, since the bonding of the main-current electrode and control electrode parts of the semiconductor device is not bonded by an Al wire, but bonded by the member of low thermal expansion, it is possible to reduce the difference of thermal expansion against the power semiconductor device 31, thereby improving the temperature cycle reliability at this electrode junction part. As a result, reliability of the whole power semiconductor device can be significantly improved. Moreover, since the heat resistant property of the electrode junction part at the upper and lower sides of the power semiconductor device 31 can be significantly improved, the allowed temperature of the power semiconductor device 31 can be improved, and as a result, the energizable allowed current can be improved, and a higher power capacity can be achieved without altering the dimensions of the device.

As described above in detail, according to this example, by bonding the rear face electrode of the power semiconductor device and the metal electrode member for external connection by using the Sn—Sb—Ag—Cu system high-temperature solder material having the composition of the range of 42 wt %$\leq$Sb/(Sn+Sb)$\leq$48 wt %, 5 wt %$\leq$Ag<20 wt %, 3 wt %$\leq$Cu<10 wt %, and Ag+Cu$\leq$25 wt %, the power semiconductor device without perfectly using lead, which has reflow resistance at 260° C., heat resistant reliability under the conditions of 200° C. 1000 hr or more, and high reliability for the temperature cycle, can be provided.

EXAMPLE 5

Figure 5:
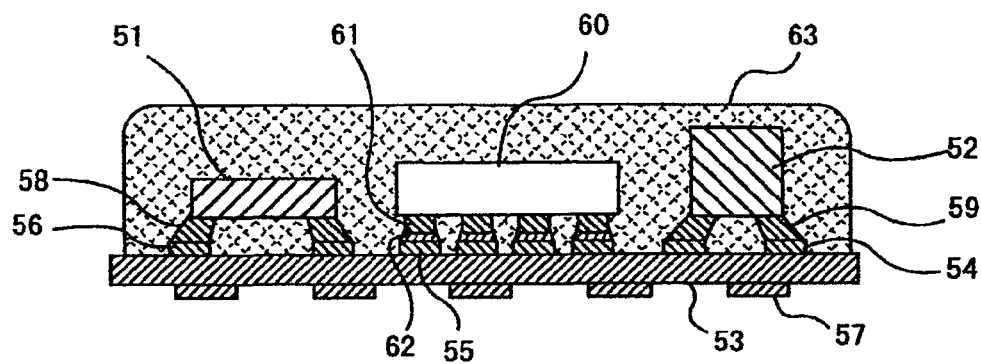
FIG. 5 is an explanatory drawing of the sectional structure of a high frequency module of Example 5.

FIG. 5 is a sectional explanatory drawing of a high frequency module of this example, and shows an example to which the Sn—b—Ag—Cu system high-temperature solder of Example 1 is applied. In FIG. 5, passive elements 51 and 52 and a high frequency semiconductor device 60 are mounted on a ceramic substrate 53. The passive elements 51 and 52 are bonded to circuit terminals 54 and 56 of the ceramic substrate 53 by high-temperature solders 58 and 59 of Example 1. Ni/Au plating is applied to the surface of electrode terminals of the passive elements 51 and 52, and Ni/Au plating is also applied to the circuit terminal of the ceramic substrate 53. A Cu bump 61 is formed in the high frequency semiconductor device 60, and Sn plating is applied to the surface thereof, thereby being provided for the bonding. The bonding is carried out by melting Sn in the surface of the Cu bump 61 and utilizing an Au—Sn eutectic reaction. The junction temperature is heated to 300° C. or more. For this reason, Cu is diffused and mixed into an Au—Sn eutectic junction part 62 thereby forming the bonding. The device mounting side of the ceramic substrate 53 is covered and protected with resin 63.

As to the assembly procedures, first, the high-temperature solder paste of Example 1 is printed and supplied to the ceramic substrate 53, and then the passive elements 51 and 52 are mounted, and thereafter solder bonding is carried out by heating to 360° C. in an $N_2$ atmosphere. Next, after taking this out to the atmosphere, the high frequency semiconductor device 60 is used for the flip-chip mount. The flip-chip bonding method is a thermocompression bonding method of a pulse heating type. Finally, the resin 63 is put on one side of the ceramic substrate by a transfer mold method.

As described above in detail, according to this example, by making the junction of the high frequency semiconductor devices, such as the passive element parts and diode parts, to be bonded by using the Sn—Sb—Ag—Cu system high-temperature solder material having the composition of the range of 42 wt %$\leq$Sb/(Sn+Sb)$\leq$48 wt %, 5 wt %$\leq$Ag<20 wt %, 3 wt %$\leq$Cu<10 wt %, and Ag+Cu$\leq$25 wt %, an electronic component without perfectly using lead having the reflow resistance at 260° C. can be provided.

According to this example, since a lead-free high-temperature solder material is used as the bonding material, high frequency modules causing only a small environmental burden can be provided. Moreover, since all of the junction parts in the high frequency module are composed of materials having a high melting-point of 280° C. or more, the problems such as short circuit or disconnection in the module will not occur even if it is heated again to 260° C. when mounting this module on electronic devices, and thus a high frequency module having the high reflow resistance at 260° C. can be provided. Moreover, since each junction part is bonded by a material having a high bonding strength and a corrosion resistance and furthermore is covered with the hard resin 63, the high frequency module excellent in the temperature cycle reliability and in the high-temperature and high humidity reliability can be provided.

EXAMPLE 6

Figure 6:
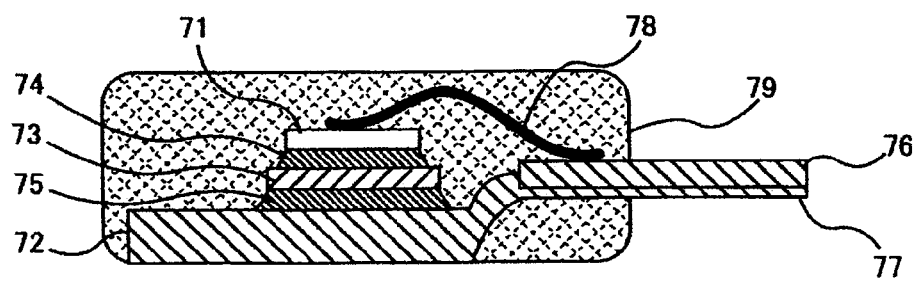
FIG. 6 is an explanatory drawing of the sectional structure of a power semiconductor package of Example 6.

FIG. 6 is a sectional explanatory drawing of a power semiconductor package of this example, and shows an example to which the high-temperature solder of Example 1 is applied. In FIG. 6, a semiconductor device 71 is die bonded, by high-temperature solders 74 and 75 of Example 1, to a die pad 72 made of Cu or made of a Cu-based alloy via a stress relief plate 73 composed of a Cu/Fe—Ni alloy/Cu laminated plate whose coefficient of thermal expansion is in the range of 8 ppm to 12 ppm. In other words to the junction surface of the die pad 72, the die pad being a metal electrode pattern-member to which the rear face electrode of the semiconductor device 71 is connected, the solder paste of Example 2 is supplied, and the stress relief plate 73 is placed thereon, and furthermore on top of this, the solder paste of Example 2 is supplied, and the semiconductor device 71 is aligned and mounted, and subsequently, the organic material of a liquid or cream form is volatilized and decomposed in advance, and is dried and removed under a high-temperature environment of 100° C. to 300° C., and then the temperature is raised to the range of 350° C. to 400° C. in a reducing atmosphere, thereby melting the high-temperature solder material and carrying out die bonding.

In the surface of the rear face electrode of the semiconductor device 71, three layers of Ti or V, or Ta/Ni/Au, or Ag are laminated and formed. The surfaces of the stress relief plate 73 and die pad 72 are composed of Cu without the plating, or Ni plating is applied thereto. The electrode of the upper surface of the semiconductor device 71 and an external terminal 76 are connected by an Al wire 78. Resin 79 is molded so as to cover a whole of the semiconductor device 71, the Al wire 78, and die-bonding area, and a part of the die pad 72 and lead terminal 76.

According to this example, since a lead-free high-temperature solder material is used as the bonding material, a power semiconductor package causing only a small environmental burden can be provided. Moreover, the thermal strain, which was burdened by the bonding material portion in the prior art because the bonding material has a high strength and a hard quality of the material, can be dispersed to the semiconductor device 71 and die pad 72, and at the same time the stress relief plate 73 of a low thermal expansion material of Cu/Fe—Ni/Cu is inserted between the semiconductor device 71 and the die pad 72, and it is therefore possible to reduce the thermal stress applied to the semiconductor device 71 and prevent a chip crack, and at the same time it is possible to extend the thermal-fatigue life of the bonding material significantly, and thus the power semiconductor packages with high reliability can be provided without reducing the productivity.

EXAMPLE 7

Figure 17:
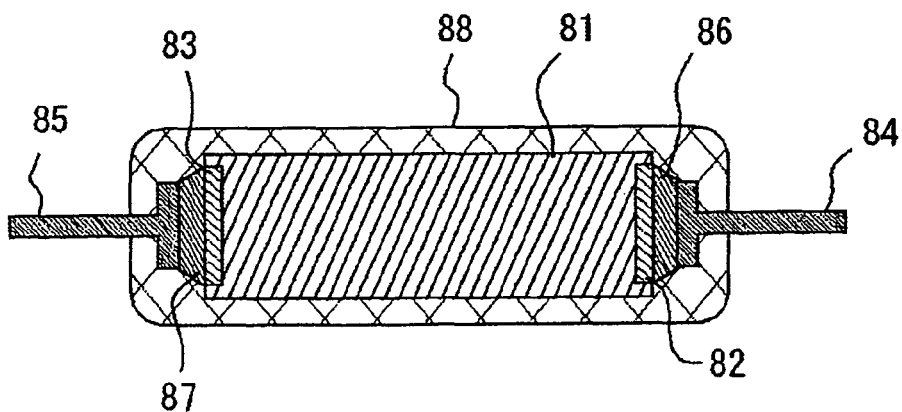
FIG. 17 is an explanatory drawing of the sectional structure of an electronic component of Example 7.

FIG. 17 shows a sectional structural drawing of an electronic component in which a ceramic capacitor is mounted by the high-temperature solder according to the present invention. In FIG. 17, at both ends of a ceramic capacitor 81 having therein a structure, in which a material of high dielectric constant is sandwiched by metal electrodes, electrode terminals 82 and 83 for connection in which surface Ni-plated film is formed are formed. To these electrode terminals, metal lead members 84 and 85 for external connection are connected by high-temperature solders 86 and 87 according to the present invention.

The raw material of the metal lead member is Cu alloy, and Ni metal plating of approximately 5 µm in thickness is applied to the surface thereof. The composition of the high-temperature solder is Sn-35Sb-10.8Ag-8.7Cu. A part of the metal lead, the junction part, and the body of the capacitor are molded with a heat-curing type insulating resin 88.

Assembly is carried out as follows: the paste prepared by mixing a rosin system flux with powders of the high-temperature solder of the present invention wherein the grain size of the powders is adjusted to the range of 0.02 mm to 0.05 mm is applied to the electrode terminal from a dispenser, and the metal lead members are aligned and set in the vertical direction, and are rapidly heated to a peak temperature of 380° C., with the after-heat temperature of 180° C., in a conveyer furnace under an nitrogen atmosphere, for the bonding and assembly. Subsequently, the flux residual liquid is washed and removed in a washing process, and molding is carried out by an injection molding machine. In addition, FIG. 18 shows the mechanical properties of the prepared Sn—Sb—Ag—Cu alloy. As shown in FIG. 18, it is apparent that No.3 alloy with 35 wt % Sb has a high strength and a high elongation at high-temperature of 200° C., and it is mechanically the most excellent composition. Since No.3 alloy with 35 wt % Sb elongates a lot at high temperature of 200° C., the effect that thermal stress is relaxed in the course of cooling after bonding is high, and an alloy with fewer amount of Sb can reduce the residual stress of a bonded sample further.

According to this example, because the electrode terminal and the lead member are bonded using an Sn—Sb—Ag—Cu alloy of a high melting-point as the bonding material, a lead-free electronic component having the reflow resistance at 260° C. can be provided. Moreover, since the breaking strength of the bonding material is high and the bonding material will not break down at normal temperature, an electronic component having high reliability in temperature cycle can be provided.

FIG. 19 shows the sectional structure of an electronic component in which a semiconductor diode is mounted by the high-temperature solder according to the present invention. Although omitted in FIG. 19, in the electrodes of the upper and lower sides of a diode device 91, on the Al vapor-deposited film of 3 µm in thickness, non-electrolyzed Ni—P metal plating of 2 µm in thickness is applied. In FIG. 19, the upper and lower side metal leads 92 and 93 composed of Cu alloy are bonded to the upper and lower side electrodes of the diode device 91, respectively, by high-temperature solders 94 and 95 made of Sn-35Sb-10.8Ag-8.7Cu alloy. The junction between a part of the metal lead and the diode device 91 is molded and protected with an epoxy sealing resin 96. Although omitted in FIG. 19, in the metal lead part exiting from the sealing resin, SnCu metal plating is applied to the surface of Cu alloy.

According to this example, since the electrode and the metal lead are bonded using an Sn—Sb—Ag—Cu alloy of a high melting-point as the bonding material, a lead-free electronic component having the reflow resistance at 260° C. can be provided. Moreover, since the Al vapor-deposited film is formed in the underlayer of the electrode of the diode device 91, the thermal strain caused by the differences in thermal expansion between the metal lead and high-temperature solder material and the Si diode device is absorbed due to the deformation of the Al vapor-deposited film which is softer as compared with these members. Therefore, it is possible to reduce the thermal stress applied to the device and junction, and to prevent the damages to the device and the thermal fatigue of the junction, thereby providing a highly reliable electronic component.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power semiconductor device comprising a power semiconductor element connected to a metallic conductor via a solder material,
    wherein the solder material comprises Sn, Sb, Ag, and Cu as the main constitutive elements,
    wherein a composition of the solder material comprises 42 wt %$\leq$Sb/(Sn+Sb)$\leq$48 wt %, 5 wt %$\leq$Ag<20 wt %, 3 wt %$\leq$Cu<10 wt %, and Ag+Cu$\leq$25 wt%, and
    wherein the solder material has a solidus temperature in a range of 300 to 330° C., a liquidus temperature in a range of 350 to 370° C., and a Vickers hardness of not more than 130 Hv.

2. The power semiconductor device according to claim 1, wherein the power semiconductor element comprises a rear face electrode,
    wherein the metallic conductor is a metallic circuit pattern arranged on a ceramic wiring board, wherein the metallic circuit pattern on the ceramic wiring board and the rear face electrode of the power semiconductor element are bonded each other via the solder material, and wherein a main-current electrode and control electrode at the metallic circuit pattern side of the power semiconductor element are connected to the metallic circuit pattern of the ceramic wiring board by a wire or a lead-like electric connection conductor.

3. The power semiconductor device according to claim 2, wherein the metallic circuit pattern on the ceramic substrate is formed of Cu, wherein a surface of the metallic circuit pattern is plated with Ni—P, and an uppermost surface of the rear face electrode of the power semiconductor element is plated with Ni—P or Ni—P/Au.

4. The power semiconductor device according to claim 1, wherein the power semiconductor element and the metallic conductor are bonded each other by the solder material via a composite material plate, and wherein the composite material plate is formed by laminating a first Cu layer, a Fe—Ni alloy layer, and a second Cu layer.

5. The power semiconductor device according to claim 4, wherein the metallic conductor is a die pad.

6. An electronic component comprising a passive element or a semiconductor element:

wherein the passive element or the semiconductor element comprises a first electrode, a first external metal lead member, a second electrode, and a second external metal lead member, wherein the first electrode and the first external metal lead member as well as the second electrode and the second external metal lead member are bonded each other by a solder material, wherein the solder material comprises Sn, Sb, Ag, and Cu as the main constitutive elements wherein the solder material comprises 42 wt %$\leq$Sb/(Sn+Sb)$\leq$48 wt %, 5 wt %$\leq$Ag<20 wt %, 3 wt %$\leq$Cu<10 wt %, and Ag+Cu$\leq$25 wt %, and optionally at least one element selected from the group consisting of Ni, Ge, Ga and P of 0.001 wt % to 2.0 wt %, and wherein the solder material has a solidus temperature in a range of 300 to 330° C., a liquids temperature in a range of 350 to 370° C., and a Vickers hardness of not more than 130 Hv.

7. The electronic component according to claim 6, wherein the electrode comprises a Ni layer or a NiP layer formed in an uppermost surface layer or in a second surface layer.

8. The electronic component according to claim 6, wherein the metal lead member comprises a Cu material having Cu content of 99.9 wt % or more and Vickers hardness of 60 Hv or less.

* * * * *